United States Patent
Aida et al.

(10) Patent No.: US 12,227,828 B2
(45) Date of Patent: Feb. 18, 2025

(54) STRUCTURE FOR PRODUCING DIAMOND AND METHOD FOR MANUFACTURING SAME

(71) Applicants: National University Corporation Nagaoka University of Technology, Nagaoka (JP); Atsuhito Sawabe, Sagamihara (JP); Yutaka Kimura, Sagamihara (JP); WASEDA UNIVERSITY, Tokyo (JP); DISCO Corporation, Tokyo (JP)

(72) Inventors: Hideo Aida, Nagaoka (JP); Atsuhito Sawabe, Sagamihara (JP); Yutaka Kimura, Sagamihara (JP); Jun Mizuno, Tokyo (JP); Ryuji Oshima, Tokyo (JP)

(73) Assignees: National University Corporation Nagaoka University of Technology, Nagaoka (JP); Atsuhito Sawabe, Sagamihara (JP); Yutaka Kimura, Sagamihara (JP); WASEDA UNIVERSITY, Tokyo (JP); DISCO Corporation, Tokyo (JP)

( * ) Notice: Subject to any disclaimer, the term of this patent is extended or adjusted under 35 U.S.C. 154(b) by 421 days.

(21) Appl. No.: 17/507,417

(22) Filed: Oct. 21, 2021

(65) Prior Publication Data
US 2022/0127719 A1  Apr. 28, 2022

(30) Foreign Application Priority Data

Oct. 22, 2020 (JP) ................................ 2020-177489

(51) Int. Cl.
C23C 16/02 (2006.01)
C23C 14/14 (2006.01)
(Continued)

(52) U.S. Cl.
CPC ............ *C23C 14/14* (2013.01); *C30B 23/025* (2013.01); *C30B 25/186* (2013.01); *C30B 29/02* (2013.01);
(Continued)

(58) Field of Classification Search
CPC ... C23C 14/14; C23C 16/0272; C23C 16/272; C23C 16/274; C23C 16/279;
(Continued)

(56) References Cited

U.S. PATENT DOCUMENTS 5,743,957 A * 4/1998 Kobashi ............. H01L 21/0237
427/249.8
9,076,653 B2   7/2015 Noguchi
(Continued)

FOREIGN PATENT DOCUMENTS

CN  101892521 A  11/2010
DE  19631107 A1  2/1997
(Continued)

OTHER PUBLICATIONS

Ohtsuka et al., "Epitaxial Growth of Diamond on Iridium", Jpn. J. Appl. Phys., 1996, pp. 1072-1074, vol. 35.

*Primary Examiner* — Humera N. Sheikh
*Assistant Examiner* — Kevin CT Li
(74) *Attorney, Agent, or Firm* — The Webb Law Firm

(57) ABSTRACT

Provided are a structure for producing a high-quality single crystal diamond, and a method for manufacturing the structure for producing diamond. A structure for producing a diamond is composed of a base substrate and an Ir thin film formed on the base substrate. The thermal expansion coefficient of the base substrate is 5 times or less of the thermal expansion coefficient of diamond and the melting point of the base substrate is 700° C. or higher. The peak angle in the X-ray diffraction pattern of the Ir thin film is different from
(Continued)

the peak angle in the X-ray diffraction pattern of the base substrate.

8 Claims, 6 Drawing Sheets

(51) Int. Cl.
    *C23C 16/27*           (2006.01)
    *C30B 23/02*           (2006.01)
    *C30B 25/18*           (2006.01)
    *C30B 29/02*           (2006.01)
    *C30B 33/00*           (2006.01)

(52) U.S. Cl.
    CPC ........... *C30B 33/00* (2013.01); *Y10T 428/265* (2015.01); *Y10T 428/31678* (2015.04)

(58) Field of Classification Search
    CPC ... C30B 25/183; C30B 23/025; C30B 25/186; C30B 29/02; C30B 29/04; C30B 33/00; Y10T 428/265; Y10T 428/31678
    See application file for complete search history.

(56) References Cited

U.S. PATENT DOCUMENTS

| | | |
|---|---|---|
| 9,988,737 B2 | 6/2018 | Nebel et al. |
| 2010/0294196 A1* | 11/2010 | Noguchi ........... H01L 21/02021<br>117/88 |
| 2016/0208413 A1* | 7/2016 | Nebel ..................... C30B 29/04 |

FOREIGN PATENT DOCUMENTS

| | | |
|---|---|---|
| DE | 102015200692 A1 | 7/2016 |
| JP | 2012001394 A * | 1/2012 |

* cited by examiner

[FIG.1]
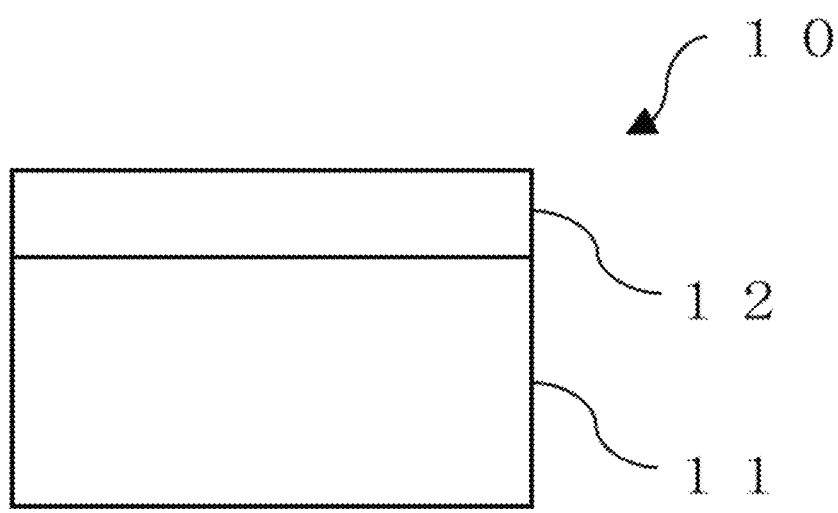

MgO

Ir film forming

Si-Ir bonding

Removing MgO by polishing

[FIG.6]
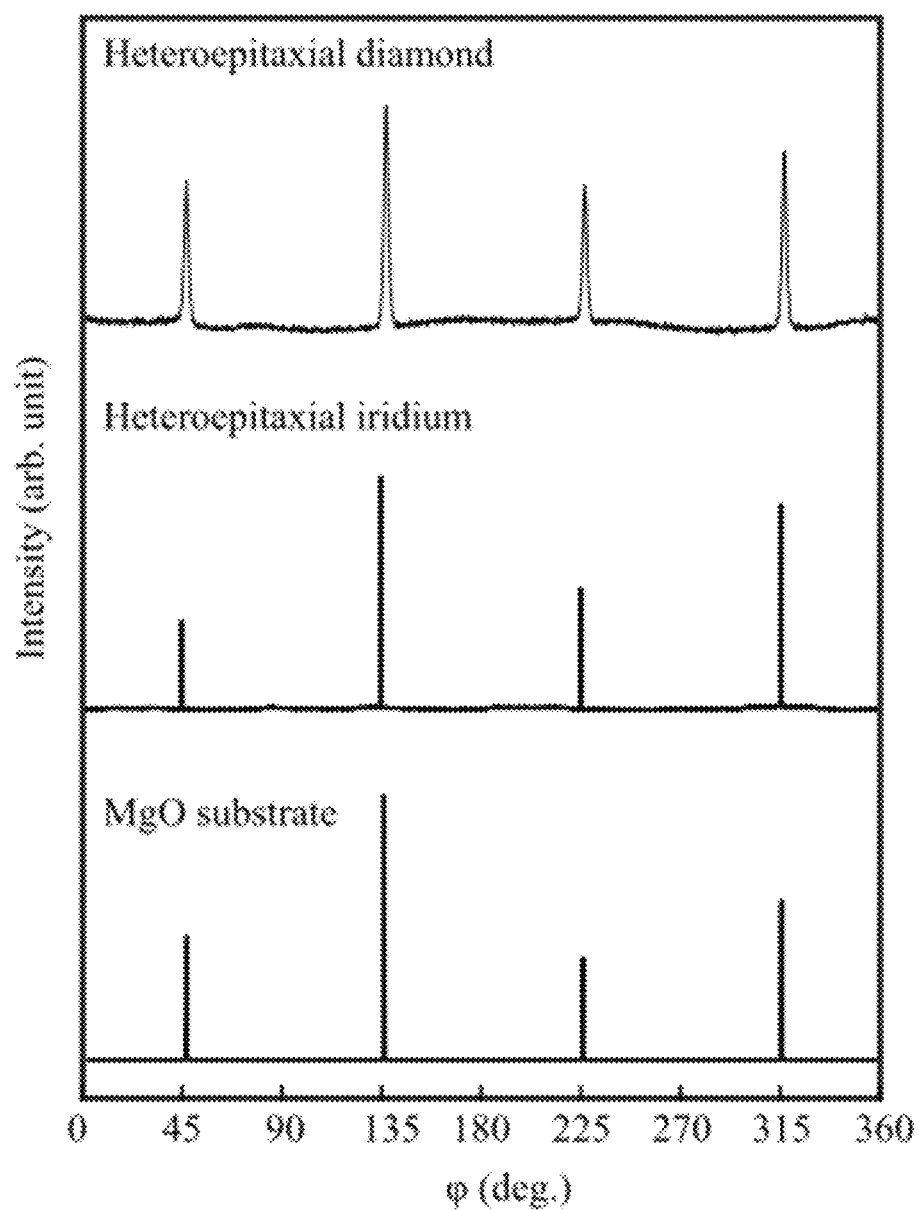

STRUCTURE FOR PRODUCING DIAMOND AND METHOD FOR MANUFACTURING SAME

CROSS-REFERENCE TO RELATED APPLICATION

This application claims priority to Japanese Patent Application No. 2020-177489 filed Oct. 22, 2020, the disclosure of which is hereby incorporated by reference in its entirety.

BACKGROUND

Technical Field

The present invention relates to a structure for producing diamond capable of epitaxially growing a large-sized diamond, and a method for manufacturing the structure for producing diamond. In particular, the present invention relates to a structure for producing diamond by chemical vapor deposition (hereinafter, simply referred to as "CVD").

Background Art

Conventionally, there are various methods for growing diamond. In recent years, there has been a demand for increasing in size of CVD diamonds, and among them, the heteroepitaxial growth method has attracted attention. In this growth method, if there is a base material capable of growing a large-diameter diamond, a single crystal diamond having the same size as this base material can be grown.

In the heteroepitaxial growth method, the base material structure that enables the formation of diamond film has been studied for many years. As a result, by using single crystal Ir as a base material, it has become possible to grow single crystal diamond on it.

However, in the case of forming a large-diameter diamond, it is needed to obtain a large-diameter single crystal Ir, but it is practically impossible to obtain a large-diameter single crystal Ir. Therefore, in the actual process, it is needed to epitaxially grow the Ir thin film on the base material. In addition, since large-diameter diamonds are expensive, reducing the cost is also a major issue. Therefore, studies on a base material for forming an Ir thin film have been continued. The main requirements for the base material are the following three points.

First point: It is possible to form an Ir thin film with a certain level of crystal quality sufficient to allow heteroepitaxial growth of high quality diamond.

Second point: The difference in thermal expansion coefficient between the base material and diamond is as small as possible.

Third point: It can withstand the temperature, gas atmosphere or the like in the diamond growth environment and does not crack.

In view of these three requirements, examples of the base material include MgO, sapphire, and Si.

However, these base materials do not always satisfy the above three requirements. MgO and sapphire meet the requirements of the first and third points, and high quality diamond can be obtained on the Ir thin film on these base materials. However, the thermal expansion coefficient of MgO is about $13.1 \times 10^{-6}/°C$. and the thermal expansion coefficient of sapphire is about $7.7 \times 10^{-6}/°C$., whereas the thermal expansion coefficient of diamond is about $1.1 \times 10^{-6}/°C$. As such, the difference in the thermal expansion coefficient between these base materials and diamond is large, and the formed diamond cannot withstand the thermal stress applied during film formation and cracks, thereby it makes difficult to increase in the size of the diamond. Several growth technique approaches have been reported to suppress cracks. However, as long as base materials such as MgO or sapphire, which have a large difference in thermal expansion coefficient from diamond, are used, the problem cannot be solved essentially. It is conceivable to increase the film thickness of the Ir thin film in order to suppress cracks in the Ir thin film. However, such increasing the film thickness is costly and consumes a lot of manufacturing time, then it should be avoided.

On the other hand, the thermal expansion coefficient of Si is about $2.4 \times 10^{-6}/°C$., which is close to the thermal expansion coefficient of diamond and can withstand the growth environment of diamond, then the requirements of the second and third points are satisfied. However, the quality of the Ir thin film formed on Si is not good, and diamond cannot be heteroepitaxially grown on it, then the requirement of first point is not satisfied. Accordingly, a structure in which an intermediate layer is formed on Si and an Ir film is formed on the intermediate layer is being studied.

For example, Patent Document 1 discloses a base material for forming a single crystal diamond in which graphite is formed on single crystal Si or the like and an Ir film is formed on the graphite. The document describes that by providing a graphite layer on single crystal Si or the like, the stress generated between the base material and the single crystal diamond can be reduced as compared with the case where a conventional MgO seed base material is used.

Patent Document 1: Japanese Unexamined Patent Application Publication No. 2012-001394

SUMMARY

However, in the base material for forming a single crystal diamond described in Patent Document 1, even if the intermediate layer is graphite and the film can be formed at low cost, the cost cannot be suppressed because the manufacturing process becomes complicated. Furthermore, because the Ir thin film grows heteroepitaxially on graphite, the quality of the Ir thin film depends on graphite. Furthermore, there is a concern that graphite may contaminate the single crystal diamond.

As described above, in the conventional configuration, the Ir thin film is more likely to be deteriorated, which may affect the quality of diamond. Further studies are needed to obtain high quality single crystal diamonds.

Therefore, an object of the present invention is to provide a structure for producing a high-quality single crystal diamond, and a method for manufacturing the structure for producing diamond.

In order to obtain an inexpensive structure, the present inventors have studied the growth of diamond using a thin Ir thin film. Furthermore, as described above, there are mainly three types of base materials for forming the Ir thin film, MgO, sapphire, and Si, but when these are used, the advantages and disadvantages of each must be considered. Therefore, the diamond growth process was studied so that a thin, high-quality Ir thin film could be used regardless of the material of the base material.

In order to satisfy all the above three requirements, the present inventors have focused on changing the process so as not to directly form an Ir thin film on the base material. As a result, the present inventors have realized that after forming Ir on a dummy substrate capable of forming a high-quality Ir thin film, and the obtained Ir thin film is transferred onto base substrate that has as small difference of thermal expansion coefficient as possible from diamond and can withstand the diamond growth environment. Conventionally, as described in Patent Document 1 and the like, it has been said that the desired diamond could not be produced without heteroepitaxially growing the seed base material for growing diamond on an intermediate layer such as a base material (hereinafter referred to as "base substrate") or graphite. That is, conventionally, it has been said that the Ir thin film is heteroepitaxially grown on the base substrate or the intermediate layer, and there was a need for a relationship between the Ir thin film and the base substrate or the intermediate layer in terms of crystal structure and crystal orientation.

On the other hand, the base substrate onto which the Ir thin film was transferred was completed based on the finding in the above study of the present invention that high quality diamond can be formed even when the crystal structure or crystal orientation of the Ir thin film and the base substrate are not related. In other words, according to the present invention, when the peak angle in the XRD diffraction pattern is deviated between the crystal lattice of the Ir thin film and the crystal lattice of the base substrate located directly under the Ir thin film, a better diamond can be formed. Along with this, it has been found that if the Ir thin film is transferred onto the base substrate as in the present invention, high quality diamond is formed without providing an intermediate layer.

The present invention completed based on these findings is as follows.

(1) A structure for producing a diamond composed of a base substrate and an Ir thin film formed on the base substrate,
wherein the thermal expansion coefficient of the base substrate is 5 times or less of the thermal expansion coefficient of diamond;
the melting point of the base substrate is 700° C. or higher; and
the peak angle in the X-ray diffraction pattern of the Ir thin film is different from the peak angle in the X-ray diffraction pattern of the base substrate.

(2) The structure for producing a diamond according to (1) above, wherein the full width at half maximum of the (002) plane in the rocking curve of the Ir thin film is 700 arcsec or less.

(3) The structure for producing a diamond according to (1) or (2) above, wherein the Ir thin film has a film thickness of 1 µm or less.

(4) The structure for producing a diamond according to any one of (1) to (3) above, wherein the base substrate is Si or diamond.

(5) A method for manufacturing the structure for producing the diamond according to any one of (1) to (4) above, comprising:
an Ir film forming step of forming an Ir thin film on a dummy substrate having a melting point of 700° C. or higher;
a mounting step of mounting the dummy substrate on which an Ir thin film is formed on a beforehand-prepared base substrate so that the Ir thin film formed in the Ir film forming step and the beforehand-prepared base substrate are in contact with each other;
a bonding step of bonding the base substrate and the Ir thin film after the mounting step; and
a removing process of removing the dummy substrate after the bonding step.

(6) The method for manufacturing the structure for producing the diamond according to (5) above, wherein the dummy substrate is MgO or sapphire.

BRIEF DESCRIPTION OF THE DRAWINGS

FIG. 1 is a cross section of the structure according to the present invention.

FIG. 2 is a schematic view of a structure in which an Ir thin film is formed on a base substrate.

FIG. 3 is a process chart showing an example of a method for manufacturing a structure according to the present invention.

FIG. 4 shows a diagram showing the results of measuring the XRD rocking curve of the Ir thin film formed on the MgO substrate.

FIG. 5 is a diagram showing an XRD diffraction pattern during the production of the structure according to the present invention.

FIG. 6 is a diagram showing an XRD diffraction pattern of diamond, Ir, and MgO when diamond is heteroepitaxially grown on a structure in which an Ir thin film is heteroepitaxially grown on an MgO substrate.

DETAILED DESCRIPTION

Figure 2A:
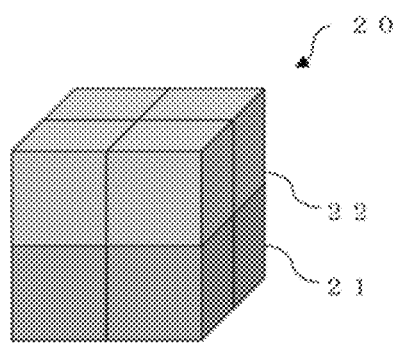
FIG. 2A is a schematic view of a structure in which an Ir thin film is heteroepitaxially grown on a base substrate.

The present invention is described in more detail below.

1. Structure (1) Basic Configuration of Structure

A structure for producing a diamond according to the present invention is composed of a base substrate 11 and an Ir thin film 12 formed on the base substrate 11 as shown in FIG. 1. The base substrate 11 and the Ir thin film 12 of the present invention is described in more detail below.

(2) Base Substrate

The base substrate 11 of the present invention needs to have a thermal expansion coefficient of 5 times or less of the thermal expansion coefficient of diamond and a melting point of 700° C. or higher. Because diamond is formed at a high temperature of at least 700° C. or higher, the melting point of the base substrate 11 on which the Ir thin film 12 is formed needs to be 700° C. or higher, preferably 800° C. or higher, more preferably 1000° C. or higher.

Furthermore, in such a high temperature environment, if the difference in the thermal expansion coefficient between these base materials 11 and diamond is too large, warp occurs during cooling after the diamond is formed, and thereby the diamond is cracked. Therefore, the thermal expansion coefficient of the base substrate 11 of the present invention needs to be 5 times or less of the thermal expansion coefficient of diamond. Preferably, the thermal expansion coefficient of the base substrate 11 of the present invention is 3 times or less of the thermal expansion coefficient of diamond. The lower limit is not particularly limited, but the thermal expansion coefficient of the base substrate 11 of the present invention is preferably 0.125 times or more, more preferably 0.2 times or more, and even more preferably 0.33 times or more of the thermal expansion coefficient of diamond.

Examples of the base substrate 11 satisfying these requirements include Si and diamond. When diamond is used, the diameter must be small-diameter because there is no large-diameter diamond that is a single crystal formed by high-temperature and high-pressure synthesis. In order to obtain a large-diameter diamond, a diamond different from the diamond obtained by the structure according to the present invention, such as polycrystalline or sintered, can be used.

Although the thermal expansion coefficient of Ir is slightly larger than the thermal expansion coefficient of diamond or Si, this does not affect the quality of diamond, so diamond or Si may be used in the present invention. On the other hand, because the thermal expansion coefficient of MgO and sapphire is too large compared to the thermal expansion coefficient of diamond, the quality of diamond deteriorates even when the crystal structure and crystal orientation are not related between MgO or sapphire and the Ir thin film.

In order to manufacture at low cost, the base substrate 11 is preferably Si.

The thickness of the base substrate 11 may be about 0.01 to 15 mm as long as it is a normal thickness used for forming diamond. The size of the diameter is not particularly limited, but 0.5 inch or more is desirable.

(3) Ir Thin Film

The Ir thin film 12 of the present invention is not epitaxially grown on the base substrate 11, but is formed by transferring a film formed on a dummy substrate, which will be described later, onto the base substrate 11. Therefore, the peak angle in the XRD diffraction pattern is deviated between the base substrate 11 and the Ir thin film 12, and the crystal structure and the crystal orientation is not related unlike the case where the film is formed by epitaxial growth. The fact that the crystal structure and crystal orientation of the Ir thin film 12 and the base substrate 11 are not related is represented by that the peak angle in the X-ray diffraction pattern of the Ir thin film 12 is different from the peak angle in the X-ray diffraction pattern of the base substrate 11.

Figure 2B:
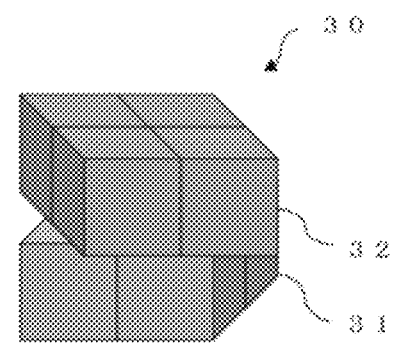
FIG. 2B is a schematic view of a structure in which an Ir thin film is transferred onto a base substrate.

FIG. 2 is a schematic view of a structure in which an Ir thin film 22 is formed on a base substrate 21. FIG. 2A is a schematic view of a structure 20 in which an Ir thin film 22 is heteroepitaxially grown on a base substrate 21. FIG. 2B is a schematic view of a structure 30 in which an Ir thin film 32 is transferred onto a base substrate 31.

As shown in FIG. 2A, the Ir thin film 22 heteroepitaxially grown on the base substrate 21 grows in the same orientation as the crystal orientation of the base substrate 21. Furthermore, the crystal structure of the Ir thin film 22 depends on the base substrate 21. Therefore, the XRD diffraction patterns of the base substrate 21 and the Ir thin film 22 show the same peak angle. On the other hand, as shown in FIG. 2B, because the Ir thin film 32 transferred onto the base substrate 31 is grown on a dummy substrate different from the base substrate 31, the transferred Ir thin film 32 and the base substrate 31 have different crystal structures and crystal orientations, thereby the peak angles of the XRD diffraction patterns is deviated. More specifically, all the peak angles measured by the XRD diffraction pattern of the Ir thin film 32 deviate from the peak angles of the base substrate 31.

However, even when the Ir thin film 22 is heteroepitaxially grown on the base substrate 21, the peak angle may deviate. In this case, only a predetermined peak may deviate, however not all the peak angles measured deviate unlike in the structure according to the present invention. The deviation of the peak angle in the structure according to the present invention is due to the deviation of the crystal structure and the crystal orientation, and can be easily distinguished from the deviation of the peak angle due to the defect in heteroepitaxial growth.

In addition, in some heteroepitaxial growth, a deviation in peak angle may be observed at all peaks. For example, this is the case when a cubic film is formed on a hexagonal substrate. However, the deviation of the peak angle in this case is a unique value that can be calculated from the lattice constant. Therefore, unlike the structure according to the present invention, all peak angles do not shift randomly.

The Ir thin film 12 of the present invention shown in FIG. 1 has a quality capable of forming diamond regardless of the base substrate 11. The rocking curve data measured by XRD can be used as one of the indexes for evaluating the quality of the Ir thin film 12. The narrower the full width at half maximum of the XRD rocking curve, the smaller the degree of fluctuation in the plane orientation, and the diamond heteroepitaxial growth becomes possible. Preferably, the full width at half maximum of the (002) plane in the rocking curve of the Ir thin film 12 is 700 arcsec or less.

Here, the reason for paying attention to the rocking curve of the (002) plane in the Ir thin film is as follows. Originally, the Ir thin film also needs to have a (001) orientation in order to produce a diamond whose main surface is a (001) plane. Therefore, it is needed to investigate whether the Ir thin film exists with the (001) plane as the main plane. In demonstrating this by XRD, not only the (002) plane but also the (001) plane, the (003) plane, the (004) plane and the like of the Ir thin film may be measured. However, the diffraction phenomenon cannot be obtained practically for all of these surfaces. In the case of Ir, the measurement is performed on the (002) plane or the (004) plane. Therefore, in a preferred embodiment of the present invention, as a result of paying attention to the full width at half maximum of the (002) plane, it is found that a higher quality Ir thin film can be obtained if the full width at half maximum of the (002) plane is within the above range.

The full width at half maximum of the (002) plane is more preferably 650 arcsec or less, and more preferably 550 arcsec or less. The lower limit is not particularly limited, but it is preferable that the XRC full width at half maximum is small, and the XRC full width at half maximum may be equal to the inherent half width determined by the XRD radiation source. For example, the XRC full width at half maximum may be 30 arcsec or more.

The film thickness of the Ir thin film 12 of the present invention may be 5 μm or less. Conventionally, in order to form a high-quality Ir thin film 12, a thick Ir thin film has to be formed on a dummy substrate having a large difference in thermal expansion coefficient from diamond. It has been said that the Ir thin film needs to have a film thickness of 400 μm or more in order to suppress the warp generated during cooling after the diamond is formed. However, in the present invention, because the base substrate 11 having a small difference in thermal expansion coefficient from that of diamond can be used, high quality diamond can be formed even if the film thickness of the Ir thin film 12 is 5 μm or less. The film thickness of the Ir thin film 12 is preferably 5 μm or less, more preferably 1 μm or less, and even more preferably 0.5 μm or less. The lower limit of the film thickness of the Ir thin film 12 is not particularly limited, but the minimum film thickness that functions as a diamond seed base material may be 0.0005 μm or more. Further, the Ir thin film 12 of the present invention may be either a single crystal or a polycrystal.

Furthermore, as described below, because the dummy substrate is removed after the Ir thin film 12 is transferred onto base substrate, the surface of the Ir thin film 12 of the present invention is a polished surface. Therefore, high-quality diamond having extremely low surface roughness can be formed.

2. Methods for the Manufacturing Structure

Figure 3A:
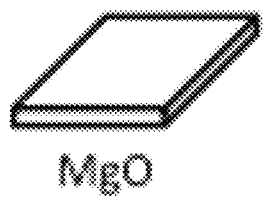
FIG. 3A is a perspective view showing a dummy substrate of MgO.
Figure 3B:
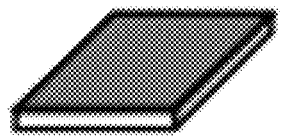
FIG. 3B is a perspective view in which an Ir thin film is formed on MgO.
Figure 3C:
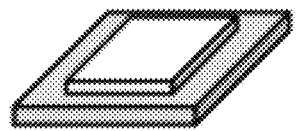
FIG. 3C is a perspective view in which MgO on which an Ir thin film is formed is mounted on a Si substrate and bonded.
Figure 3D:
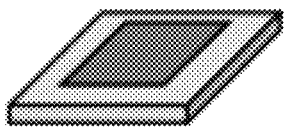
FIG. 3D is a perspective view showing a structure after polishing MgO after bonding.

The method for manufacturing a structure according to the present invention is a method for manufacturing a structure above according to the present invention. FIG. 3 is a process chart showing an example of a method for manufacturing a structure according to the present invention. FIG. 3A is a perspective view showing a dummy substrate of MgO. FIG. 3B is a perspective view in which an Ir thin film is formed on MgO. FIG. 3C is a perspective view in which MgO on which an Ir thin film is formed is mounted on a Si substrate and bonded. FIG. 3D is a perspective view showing a structure after polishing MgO after bonding. In the present embodiment, the dummy substrate is not limited to MgO, and the base substrate is not limited to Si, which are merely examples. It will be described in detail with reference to FIG. 3.

(2-1) Selection of Dummy Substrate

First, a dummy substrate capable of forming a high-quality Ir thin film is prepared. The dummy substrate is preferably one that does not melt at about 700° C., which is the heating temperature for forming Ir, and may have a melting point of 700° C. or higher. The upper limit of the melting point of the dummy substrate is not particularly limited, but may be about 4000° C. For example, MgO or sapphire can be mentioned. From the viewpoint of producing diamond that is the purpose of producing at low cost, MgO is preferable. The surface roughness of the dummy substrate may be such that the Ir thin film can be formed so as to have a quality that does not deteriorate the quality of diamond. Ra, that is arithmetic mean roughness, of the dummy substrate may be 5 nm or less, more preferably 1 nm or less, and further preferably 0.5 nm or less. The lower limit of Ra of the dummy substrate is not particularly limited, but may be 0.01 nm or more.

(2-2) Film formation of Ir Thin Film

Then, an Ir thin film is formed on the dummy substrate. A conventional method using a sputter method may be used for a method for forming an Ir thin film. In order to shorten the film formation time and improve the stability of quality, in the present invention, it may be heteroepitaxially grown using DC sputtering method, RF magnetron sputtering method or the like. The film may be formed, for example, at an film formation temperature of 700 to 1300° C., and an under Ar gas atmosphere of about $1 \times 10^{-1}$ to $1 \times 10^{-5}$ Torr.

(2-3) Mounting of Dummy Substrate

The formed Ir thin film is transferred onto the base substrate. In the present invention, first, a dummy substrate is mounted onto the base substrate so that the formed Ir thin film and the beforehand-prepared base substrate are in contact with each other. Furthermore, since the base substrate is the same as that described in the above-mentioned diamond forming structure, the description thereof will be omitted.

(2-4) Bonding of Ir Thin Film

The Ir thin film is bonded to the base substrate. They are bonded, for example, at a heating temperature of 100 to 300° C., with a pressing force for the dummy substrate of 0.1 to 10 MPa, and with a heating time of 10 to 120 minutes. The atmosphere may be a vacuum of about 0.1 to 100 Torr.

(2-5) Removing of Dummy Substrate

Finally, by removing MgO, which is a dummy substrate, a high quality Ir thin film can be formed on Si. As a method for removing MgO, it may be removed by polishing or the like. It is preferable to polish to the extent that the peak derived from MgO is not measured by XRD. In this case, the Ir thin film is also slightly polished, but it is sufficient that the film thickness on which the diamond can be formed remains.

3. Method for Forming Diamond Film.

In the method for producing a diamond using the structure according to the present invention, heteroepitaxial growth is mainly carried out on an Ir thin film by CVD to form a film. It may be either microwave CVD or DC plasma CVD. The film formation temperature may be about 700 to 1200° C.

As described above, in the structure for producing diamond according to the present invention, a high-quality Ir thin film is provided on a base substrate having a small difference in thermal expansion coefficient from diamond. This is a configuration that could not be achieved by the conventional step of epitaxially growing an Ir thin film on a base substrate. This makes it possible to produce large-diameter, high quality diamonds.

Furthermore, because the structure according to the present invention does not need to have an intermediate layer interposed between the base substrate and the Ir thin film unlike in the conventional case, in the method for manufacturing a structure according to the present invention, diamond can be produced at low cost while shortening the production time.

EXAMPLES

Hereinafter, the present invention will be specifically shown, but the present invention is not limited thereto.

First, a 10 mm square MgO substrate capable of forming a high-quality Ir thin film was prepared, and an Ir thin film having a film thickness of 450 nm was formed. The sample was made using DC sputtering whose target is Ir, and the film forming conditions were Ar gas of $3 \times 10^{-3}$ Torr and MgO temperature in the range of 1100 to 1200° C. Samples were prepared under two conditions: a first condition using MgO having a surface roughness of Ra=0.4 nm and a second condition using MgO having a surface roughness of Ra=0.1 nm. In order to confirm the quality of the formed Ir thin film, the XRD rocking curve data was measured using the X'Pert-PRO MRD system (CuKα ray) manufactured by PANalytical.

Figure 4A:
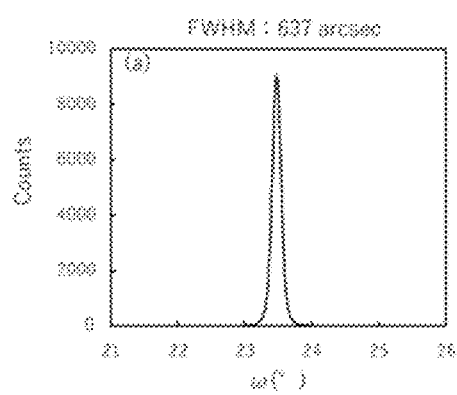
FIG. 4A and FIG. 4B are diagrams showing the results of measuring the XRD rocking curve of Ir thin films each formed under different film forming conditions.
Figure 4B:
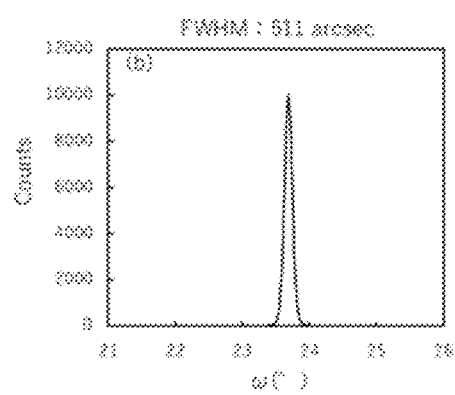

FIG. 4 shows a diagram showing the results of measuring the XRD rocking curve of the Ir thin film formed on the MgO substrate. FIG. 4A and FIG. 4B are diagrams showing the results of measuring the XRD rocking curve of Ir thin films each formed under different film forming conditions. The result of forming a film under the first condition above is shown in FIG. 4A, and the result of forming a film under the second condition above is shown in FIG. 4B. As shown in FIG. 4, under each film forming condition, all the full width at half maximum of the (002) plane in the rocking curve were 700 arcsec or less. Therefore, it is considered that each Ir thin film can form a high quality diamond.

Next, each MgO substrate on which the Ir thin film was formed was mounted on the Si substrate beforehand-prepared so that the Ir thin film was in contact with the Si substrate.

After that, the Ir thin film and the Si substrate were bonded in a vacuum atmosphere having a heating temperature of 250° C., a heating time of 60 minutes, and 7.5 Torr. At this time, a pressure of 1 MPa was applied to MgO.

Figures 5A, 5B, 5C:
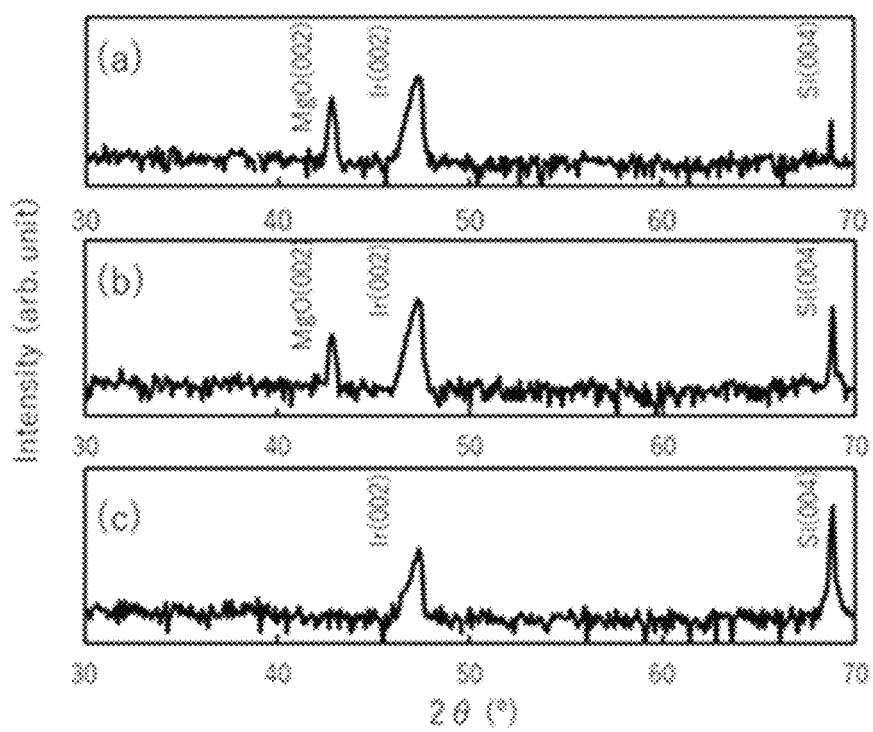
FIG. 5A and FIG. 5B are diagrams showing an XRD diffraction pattern during the removal of MgO by polishing.
FIG. 5C is a diagram showing an XRD diffraction pattern after polishing of MgO is completed.

Finally, MgO was removed by polishing to prepare a structure. FIG. 5 is a diagram showing an XRD diffraction pattern during the production of the structure according to the present invention. FIG. 5A and FIG. 5B are diagrams showing an XRD diffraction pattern during the removal of MgO by polishing. FIG. 5C is a diagram showing an XRD diffraction pattern after polishing of MgO is completed. The apparatus used for the measurement in FIG. 5 was the same as the XRD diffractometer used for the measurement in FIG. 4, and the measurement was performed by the θ/2θ method.

As shown in FIG. 5A, at the beginning of polishing, a weak peak derived from Si was obtained in addition to the peak derived from MgO and Ir. As the polishing proceeded further, as shown in FIG. 5B, the peak intensity of the Si substrate onto which the transfer was made was observed to increase while the peak of MgO decreased. Therefore, precise control was performed to carry out micropolishing, and polishing was advanced to the vicinity of the bonding interface between the ultrathin Ir thin film having a film thickness of 450 nm and the MgO substrate. As a result, as shown in FIG. 5C, the peak based on MgO disappeared and the peak intensity of the Si substrate increased. At this time, the peak intensity of the (002) plane based on the Ir thin film also decreased slightly, but the peak intensity was necessary and sufficient for producing diamond.

As a result of examining the XRD diffraction patterns of each of the Ir thin film and the Si substrate constituting the structure thus obtained, it was confirmed that all the peak angles of each were irregularly deviated. Therefore, it was confirmed that there is no relationship between the crystal structure and crystal orientation of the Ir thin film and Si base substrate.

As a result of heteroepitaxially growing diamond by CVD in each of the structures thus obtained, high quality single crystal diamond without any defects was obtained.

On the other hand, diamond was heteroepitaxially grown by CVD on MgO in which an Ir thin film was formed under the second condition above. FIG. 6 is a diagram showing an XRD diffraction pattern of diamond, Ir, and MgO when diamond is heteroepitaxially grown on a structure in which an Ir thin film is heteroepitaxially grown on an MgO substrate. In FIG. 6, the diffraction plane of the Heteroepitaxial diamond is the (111) plane, the diffraction plane of the Heteroepitaxial iridium is the (111) plane, and the diffraction plane of the MgO substrate is the (111) plane. The apparatus used for the measurement in FIG. 6 was the same as the XRD diffractometer used in FIG. 5, and the measurement was performed by the φ scan method. As shown in FIG. 6, it was found that all of them had peaks at the same angle. It was also found that the obtained diamond had defects. It was also confirmed that there was a crack.

Similar to the above, it was confirmed that even in the structure in which the Ir thin film formed on the dummy substrate sapphire was transferred onto the MgO base substrate, all the peak angles of each were irregularly deviated. However, because the thermal expansion coefficient of MgO is more than 5 times that of diamond, the diamond was cracked as a result of heteroepitaxial growth of diamond on this structure by CVD.

EXPLANATION OF REFERENCE SYMBOLS 10, 20, 30 structure
11, 21, 31 base substrate
12, 22, 32 Ir thin film

The invention claimed is:

1. A structure for producing a diamond composed of a base substrate and an Ir thin film formed on the base substrate,
    wherein the thermal expansion coefficient of the base substrate is 5 times or less of the thermal expansion coefficient of diamond;
    wherein the melting point of the base substrate is 700° C. or higher;
    wherein the Ir thin film is a thin film formed on a dummy substrate that is different from the base substrate, and the Ir thin film is formed on the base substrate by bonding the Ir thin film to the base substrate;
    wherein all peak angles in an X-ray diffraction pattern of the Ir thin film shift randomly from all peak angles in an X-ray diffraction pattern of the base substrate; and
    there is no relationship between a crystal orientation of the Ir thin film and a crystal orientation of the base substrate.

2. The structure for producing a diamond according to claim 1, wherein the full width at half maximum of the (002) plane in a rocking curve of the Ir thin film which is taken from the X-ray diffraction pattern of the Ir thin film is 700 arcsec or less.

3. The structure for producing a diamond according to claim 1, wherein the Ir thin film has a film thickness of 1 μm or less.

4. The structure for producing a diamond according to claim 1, wherein the base substrate is Si or diamond.

5. The structure for producing a diamond according to claim 2, wherein the Ir thin film has a film thickness of 1 μm or less.

6. The structure for producing a diamond according to claim 2, wherein the base substrate is Si or diamond.

7. The structure for producing a diamond according to claim 3, wherein the base substrate is Si or diamond.

8. The structure for producing a diamond according to claim 5, wherein the base substrate is Si or diamond.

* * * * *